(12) United States Patent
Perahia et al.

(10) Patent No.: US 11,237,000 B1
(45) Date of Patent: Feb. 1, 2022

(54) DISK RESONATOR GYROSCOPE WITH OUT-OF-PLANE ELECTRODES

(71) Applicant: HRL Laboratories, LLC, Malibu, CA (US)

(72) Inventors: Raviv Perahia, Malibu, CA (US); Lian X. Huang, Malibu, CA (US); Logan D. Sorenson, Thousand Oaks, CA (US); Hung Nguyen, Los Angeles, CA (US); David T. Chang, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 369 days.

(21) Appl. No.: 16/395,601

(22) Filed: Apr. 26, 2019

Related U.S. Application Data (60) Provisional application No. 62/669,333, filed on May 9, 2018.

(51) Int. Cl.
| | |
|---|---|
| *G01C 19/5684* | (2012.01) |
| *H03H 9/125* | (2006.01) |
| *H03H 9/24* | (2006.01) |

(52) U.S. Cl.
CPC ......... *G01C 19/5684* (2013.01); *H03H 9/125* (2013.01); *H03H 9/2436* (2013.01)

(58) Field of Classification Search
CPC ... H03H 9/2436; H03H 9/125; G01C 19/5684
See application file for complete search history.

(56) References Cited

U.S. PATENT DOCUMENTS

| | | |
|---|---|---|
| 392,650 A | 11/1888 | Watrous |
| 4,426,769 A | 1/1984 | Grabbe |
| 4,898,031 A | 2/1990 | Oikawa |
| 5,203,208 A | 4/1993 | Bernstein |
| 5,226,321 A | 7/1993 | Varnham |
| 5,421,312 A | 6/1995 | Dawson |
| 5,578,976 A | 11/1996 | Yao |
| 5,604,312 A | 2/1997 | Lutz |
| 5,646,346 A | 7/1997 | Okada |
| 5,665,915 A | 9/1997 | Kobayashi |
| 5,728,936 A | 3/1998 | Lutz |
| 5,783,749 A | 7/1998 | Lee |
| 5,894,090 A | 4/1999 | Tang |
| 5,905,202 A | 5/1999 | Kubena |
| 5,920,012 A | 7/1999 | Pinson |

(Continued)

FOREIGN PATENT DOCUMENTS

| | | |
|---|---|---|
| DE | 44 42 033 | 5/1996 |
| DE | 19719601 | 11/1998 |

(Continued)

OTHER PUBLICATIONS

From U.S. Appl. No. 11/458,911 (now U.S. Pat. No. 7,581,443), Notice of Allowance dated Apr. 23, 2009.

(Continued)

*Primary Examiner* — Jeffrey M Shin
(74) *Attorney, Agent, or Firm* — Ladas & Parry (57) ABSTRACT

A sensor comprising a resonator structure arranged for resonating along a first plane; and at least one sensing electrode arranged on a second plane parallel to said first plane at a predetermined distance of said resonator structure along a direction normal to said first plane.

16 Claims, 8 Drawing Sheets

(56) References Cited

U.S. PATENT DOCUMENTS

| | | | |
|---|---|---|---|
| 5,987,985 | A | 11/1999 | Okada |
| 6,009,751 | A | 1/2000 | Ljung |
| 6,044,705 | A | 4/2000 | Neukermans |
| 6,094,985 | A | 8/2000 | Kapels |
| 6,145,380 | A | 11/2000 | MacGugan |
| 6,151,964 | A | 11/2000 | Nakajima |
| 6,155,115 | A | 12/2000 | Ljung |
| 6,164,134 | A | 12/2000 | Cargille |
| 6,182,352 | B1 | 2/2001 | Deschenes |
| 6,250,157 | B1 | 6/2001 | Touge |
| 6,263,552 | B1 | 7/2001 | Takeuchi |
| 6,282,958 | B1 | 9/2001 | Fell |
| 6,289,733 | B1 | 9/2001 | Challoner |
| 6,349,597 | B1 | 2/2002 | Folkmer |
| 6,367,326 | B1 | 4/2002 | Okada |
| 6,367,786 | B1 | 4/2002 | Gutierrez |
| 6,481,284 | B2 | 11/2002 | Geen |
| 6,481,285 | B1 | 11/2002 | Shkel |
| 6,513,380 | B2 | 2/2003 | Reeds |
| 6,515,278 | B2 | 2/2003 | Wine |
| 6,584,845 | B1 | 7/2003 | Gutierrez |
| 6,621,158 | B2 | 9/2003 | Martin |
| 6,628,177 | B2 | 9/2003 | Clark |
| 6,629,460 | B2 | 10/2003 | Challoner |
| 6,571,629 | B1 | 11/2003 | McCall |
| 6,715,352 | B2 | 4/2004 | Tracy |
| 6,796,179 | B2 | 9/2004 | Bae |
| 6,806,557 | B2 | 10/2004 | Ding |
| 6,856,217 | B1 | 2/2005 | Clark |
| 6,883,374 | B2 | 4/2005 | Fell |
| 6,985,051 | B2 | 1/2006 | Nguyen |
| 7,168,318 | B2 | 1/2007 | Challoner |
| 7,581,443 | B2 | 9/2009 | Kubena |
| 7,990,232 | B1 * | 8/2011 | Lee ............... H03H 9/02338 333/186 |
| 2002/0066317 | A1 | 6/2002 | Lin |
| 2003/0010123 | A1 | 1/2003 | Malvern |
| 2003/0029238 | A1 | 2/2003 | Challoner |
| 2004/0055380 | A1 | 3/2004 | Shcheglov |
| 2013/0319116 | A1 * | 12/2013 | Johari-Galle ...... G01C 19/5684 73/504.13 |

FOREIGN PATENT DOCUMENTS

| | | |
|---|---|---|
| EP | 0 461 761 | 12/1991 |
| EP | 1055908 | 11/2000 |
| EP | 0 971208 | 12/2000 |
| JP | 401129517 | 5/1989 |
| WO | WO 96/38710 | 12/1996 |
| WO | WO 98/15799 | 4/1998 |
| WO | WO 00/68640 | 11/2000 |
| WO | WO 01/44823 | 6/2001 |
| WO | WO 01/74708 | 10/2001 |

OTHER PUBLICATIONS

From U.S. Appl. No. 11/458,911 (now U.S. Pat. No. 7,581,443), Office Action dated Sep. 17, 2008.

From U.S. Appl. No. 11/458,911 (now U.S. Pat. No. 7,581,443), Office Action dated Jul. 2, 2008.

From U.S. Appl. No. 11/458,911 (now U.S. Pat. No. 7,581,443), Office Action dated Apr. 17, 2008.

From U.S. Appl. No. 11/458,911 (now U.S. Pat. No. 7,581,443), Office Action dated Oct. 12, 2007.

Barbour et al., "Micromechanical Silicon Instrument and Systems Development at Draper Laboratory," AIAA Guidance Navigation and Control Conference, 1996, Paper No. 96-3709 (20 pages).

Fujita et al., "Disk-shaped bulk micromachined gyroscope with vacuum sealing," Sensors and Actuators A:Physical, vol. 82, May 2000, pp. 198-204.

Johnson et al., "Surface Micromachined Angular Rate Sensor," A1995 SAE Conference, Paper No. 950538, pp. 77-83.

Putty et al., "A Micromachined Vibrating Ring Gyroscope,", Solid State Sensor and Actuator Workshop, Transducer Research Foundation, Hilton Head, 1994, pp. 213-220.

Skulski et al., "Planar resonator sensor for moisture measurements", Microwaves and Radar, 1998, MIKON '98, 12th International Conf., vol. 3, May 20-22, 1998, pp. 692-695.

Tang et al., "A Packaged Silicon MEMS Vibratory Gyroscope for Microspacecraft," Proceedings IEEE, 10th Annual Int. Workshop on MEMS, Japan, 1997, pp. 500-505.

Tang et al., "Silicon Bulk Micromachined Vibratory Gyroscope," Jet Propulsion Lab, Jun. 2, 1996 (6 pages).

Wright et al., "The HRG Applied to a Satellite Attitude Reference System," Guidance and Control, AASAAS, 1994, vol. 86 (14 pages).

* cited by examiner

| Electrode configuration | Bot Electrode(s) | Capacitive Sensitivity, $\left\|\frac{dC}{dx}\right\|$ | Top and Bot Electrodes | Capacitive Sensitivity, $\left\|\frac{dC}{dx}\right\|$ |
|---|---|---|---|---|
| Single ended | | Analytical: $\frac{\varepsilon_0 * L}{Gap}$<br><br>FEA model: $\frac{Q}{\|x * V_{sense\_dc}\|}$ | | Analytical: $2 * \frac{\varepsilon_0 * L}{Gap}$<br><br>FEA model: $2 * \frac{Q}{\|x * V_{sense\_dc}\|}$ |
| Differential | | Analytical: $2 * \frac{\varepsilon_0 * L}{Gap}$<br><br>FEA model: $2 * \frac{Q}{\|x * V_{sense\_dc}\|}$ | | Analytical: $4 * \frac{\varepsilon_0 * L}{Gap}$<br><br>FEA model: $4 * \frac{Q}{\|x * V_{sense\_dc}\|}$ |

Single-ended top and bottom electrodes has 2X capacitive sensitivity than only bottom or top electrodes
Differential is 2X capacitive sensitivity than single-ended.

G: ground potential
Q: surface charge at one electrode
x: displacement of gyro member
Vsense_dc: DC voltage bias on electrode
H: gap between electrode and gyro member
L: length of gyro member into page

| Design | Sense Gap [um] | Analytical dC/dx [fF/um] | COSOL Simulation dC/dx [fF/um] | Comment | Schematic |
|---|---|---|---|---|---|
| Si DRG with Peripheral electrodes | 5 | 166.00 | 173.73 | 2 sense electrodes; cover 1/16 arc total |  |
| | 7 | 84.24 | 85.18 | | |
| | 10 | 40.95 | 40.01 | | |
| Si DRG with Top and bottom electrodes | 3 | 34.18 (1 ring deformed)- Lower bound | 362.27 | 21 sense electrodes (1/8 arc)*4 sets |  |
| | | 303.38 (10 rings deformed)- Mid bound | | | |
| | | 538.397 (21 rings deforms)- Upper bound | | | |

- COMSOL Simulation matches analytical calculation
- Si DRG with top and bottom electrodes (Out of plane electrodes) can achieve 9X improvement comparing peripheral electrodes with 10 um sensing gap, and 2X for 5um sensing gap (reaching fabrication limit)

FIG. 8

DISK RESONATOR GYROSCOPE WITH OUT-OF-PLANE ELECTRODES

CROSS-REFERENCE TO RELATED APPLICATIONS

This application claims the priority of U.S. provisional application No. 62/669,333, filed on May 9, 2018, which is hereby incorporated by reference in its entirety.

This application is related to U.S. patent application Ser. No. 11/458,911, filed on Jul. 20, 2006 (now U.S. Pat. No. 7,581,443), the disclosure of which is hereby incorporated by reference in its entirety.

BACKGROUND

Figure 1:
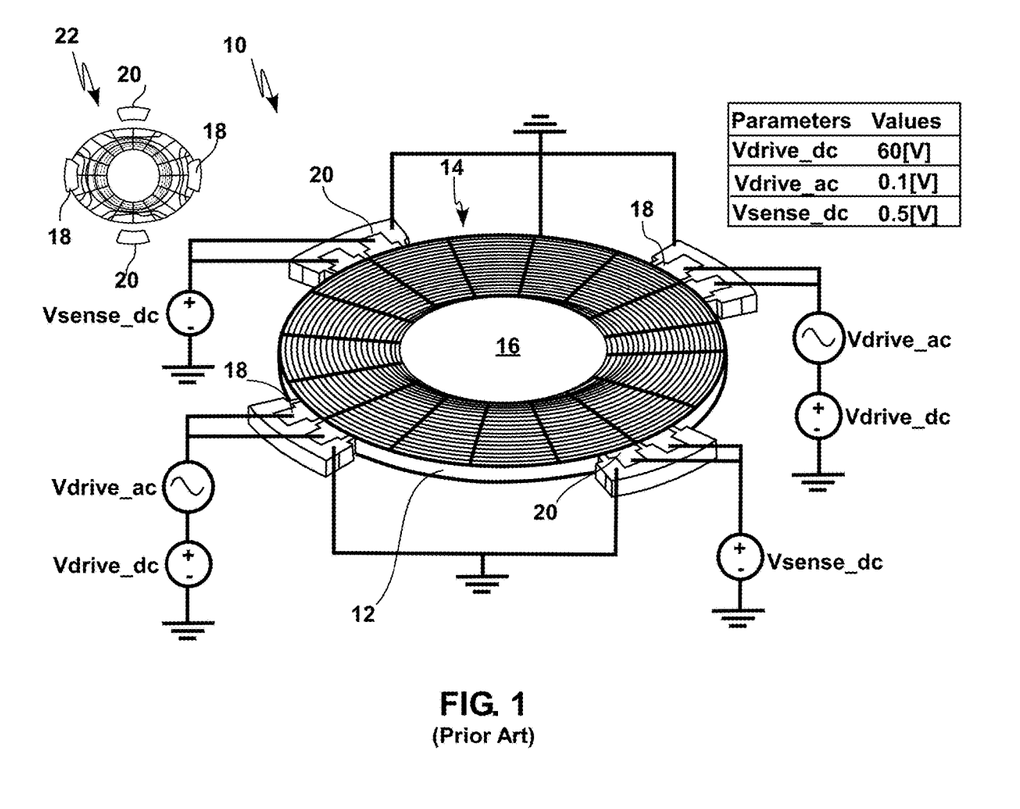
FIG. 1 illustrates a perspective view of a known disk resonator sensor.

Disk Resonator Gyroscopes are described for example in U.S. Pat. No. 7,581,443. FIG. 1 illustrates a perspective view of a known sensor 10 that comprises a disk resonator 12. Disk resonator 12 is for example made out of a number of concentric rings 14 attached to each other by radial elements to a central support 16. The concentric rings 14, central support 16 and radial elements can be formed out of a quartz or silicon wafer by etching. The sensor 10 illustrated in FIG. 1 comprises two differential driving electrodes 18 and two differential sensing electrodes 20 arranged each in the plane materialized by the concentric rings 14, at a predetermined distance from the outermost ring 14. Proper electrical stimuli applied to the driving electrodes 18 cause the rings 14 to periodically deform toward then away from driving electrodes 18, as schematized in the exaggerated deformation drawing 22 where a N=2 vibration mode of the resonator 12 is illustrated. The sensing electrodes 20 can be arranged so that the deformation of the rings 14 caused by driving electrodes 18 brings the rings away from, then toward the sensing electrodes 20. The deformation of the rings 14 increases or reduces the gap between the outwardmost ring and the sensing electrodes. This causes variations of the capacitance formed between the sensing electrodes 20 and the outward-most ring, that can be measured by the sensing electrodes.

Due to the inertia of the rings, any displacement of the resonator along the plane materialized by the concentric rings 14 causes changes in the periodic variations of the capacitance measured by sensing electrodes 20, that can be measured by sensing electrodes 20 and converted into a measurement of the displacement. Because the motion of the rings 14 is along the plane materialized by the rings 14, and because the active surfaces the driving and sensing electrodes (18, 20) are perpendicular to this plane, the motion of the rings 14 is effectively perpendicular to the active surfaces of the driving and sensing electrodes (18, 20). It follows that the transducers formed by the driving and sensing electrodes (18, 20) and the rings can be modeled approximately as parallel plate transducers, where one of the plates represents the outward most moving ring of the DRG and the other plate represents a stationary electrode surface.

A problem of known sensor 10, however, is for example that it is difficult to reduce the sensing gap between sensing electrodes 20 and the outer surface of the outward-most ring 14, which limits the sensitivity of the sensor 10.

There is a need in the art for a resonator sensor having improved sensitivity.

SUMMARY

This presentation relates to a sensor having an "out of plane electrode configuration"; in particular having a resonator structure that resonates in/along a plane, and having sensing electrodes "above" or "below" the resonator, in particular sensing electrodes parallel to said plane.

Some embodiments of this presentation address the aforementioned issues with a sensor comprising: a resonator structure arranged for resonating along a first plane; and at least one sensing electrode structure arranged on a second plane parallel to said first plane at a predetermined distance of said resonator structure along a direction normal to said first plane.

According to embodiments of this presentation, the sensor comprises at least one driving electrode arranged along said first plane.

According to embodiments of this presentation, the sensor comprises at least one sensing electrode arranged along said first plane.

According to embodiments of this presentation, said at least one sensing electrode structure is one of at least a first and a second sensing electrode structures arranged parallel to said first plane on opposite sides of said first plane at first and second predetermined distances of said resonator structure along a direction normal to said first plane.

According to embodiments of this presentation, said at least one sensing electrode structure is a differential electrode comprising two conductors separated by a gap.

According to embodiments of this presentation, said predetermined distance is smaller than 10 micrometer.

According to embodiments of this presentation, said at least one sensing electrode structure comprises a conducting layer that follows a normal projection of a portion of the resonator structure on said second plane.

According to embodiments of this presentation, the resonator structure comprises a disk resonator.

According to embodiments of this presentation, the disk resonator comprises a peripheral support structure.

According to embodiments of this presentation, the sensor comprises a baseplate wafer for supporting the disk resonator at the peripheral support structure; and a cap wafer covering the disk resonator, attached to the peripheral support structure; wherein the baseplate wafer, the cap wafer and the peripheral support structure form an enclosure of the disk resonator; and wherein said least one sensing electrode structure is arranged on one of said baseplate wafer and cap wafer inside said cavity.

According to embodiments of this presentation, the disk resonator comprises a central support.

According to embodiments of this presentation, the sensor comprises: a baseplate wafer for supporting the disk resonator at the central support; and a cap wafer covering the disk resonator; wherein the baseplate wafer and the cap wafer form an enclosure of the disk resonator, the cap wafer comprising a single wafer having a cavity forming a wall surrounding the disk resonator and the wall being bonded to the baseplate wafer to enclose the disk resonator; and wherein said least one sensing electrode is arranged on one of said baseplate wafer and cap wafer inside said cavity.

According to embodiments of this presentation, the disk resonator comprises a number of concentric rings attached to each other by a predetermined number of radial supports, wherein the radial supports attaching any first and second concentric rings are not radially aligned with the radial supports attaching said second concentric ring to a third concentric ring.

According to embodiments of this presentation, said predetermined number is 8 or is a multiple of 4.

According to embodiments of this presentation, the radial supports attaching said third concentric ring to a fourth concentric ring are aligned along a radial support axis with the radial supports attaching said first and second concentric rings.

According to embodiments of this presentation, said at least one sensing electrode structure comprises a conducting layer that follows a normal projection of a portion of the resonator structure on said second plane; said portion of the resonator structure comprising an angular quadrant arranged symmetrically on both sides of a first radial support axis.

According to embodiments of this presentation, said angular quadrant occupies half of the resonator surface between a second radial support axis immediately adjacent one side of said first radial support axis and a third radial support axis immediately adjacent the other side of said first radial support axis.

Embodiments of this presentation also relate to a method of fabricating a sensor, the method comprising: fabricating a resonator structure arranged for resonating along a first plane; and fabricating at least one sensing electrode structure on a second plane, parallel to said first plane, at a predetermined distance of said resonator structure along a direction normal to said first plane.

According to embodiments of this presentation, said fabricating a resonator structure comprises fabricating a disk resonator structure.

According to embodiments of this presentation, said fabricating a disk resonator structure comprises fabricating a disk resonator structure having a peripheral support structure.

According to embodiments of this presentation, the method further comprises: providing a baseplate wafer for supporting the disk resonator at the peripheral support structure; and attaching to the peripheral support structure a cap wafer covering the disk resonator; wherein the baseplate wafer, the cap wafer and the peripheral support structure form an enclosure of the disk resonator; wherein said fabricating at least one sensing electrode structure comprises fabricating said at least one sensing electrode structure on one of said baseplate wafer and cap wafer inside said cavity.

According to embodiments of this presentation, said fabricating a disk resonator structure comprises fabricating a disk resonator structure having a central support.

According to embodiments of this presentation, the method comprises providing a baseplate wafer for supporting the disk resonator at the central support; and providing a cap wafer covering the disk resonator; wherein the baseplate wafer and the cap wafer form an enclosure of the disk resonator, the cap wafer comprising a single wafer with a cavity forming a wall surrounding the disk resonator and the wall being bonded to the baseplate wafer to enclose the disk resonator; wherein said fabricating at least one sensing electrode structure comprises fabricating said at least one sensing electrode structure on one of said baseplate wafer and cap wafer inside said cavity.

According to embodiments of this presentation, the method further comprises fabricating at least one driving electrode arranged along said first plane.

BRIEF DESCRIPTION OF THE DRAWINGS

Referring now to the drawings in which like reference numbers represent corresponding elements throughout.

The figures are drawn to clearly illustrate the relevant aspects of the embodiments and are not necessarily drawn to scale.

DETAILED DESCRIPTION

The following detailed description relates to embodiments of this presentation. Reference is made to the accompanying drawings which form a part of the Description, and in which is shown by way of illustration specific embodiments in which the invention may be practiced. It is to be understood that other embodiments may be utilized and structural changes may be made without departing from the scope of the present invention. The present technology should in no way be limited to the example implementations, drawings, and techniques illustrated below. Additionally, the drawings are not necessarily drawn to scale.

Sensors according to embodiments of this presentation may lower gyroscope noise floor (bias instability <0.01°/hr) by increasing the capacitive sensitivity and subsequently the scale factor of a Disk Resonator Gyroscope (DRG). Certain embodiments of this presentation may comprise out-of-plane electrode(s) (OPEs), following the shape of the DRG rings, which may sense the deformation of each ring when the DRG structure is at resonance, for example at an intended rotation-sensitive N=2 mode frequency. The OPEs according to some embodiments of this presentation may increase the capacitive interaction with the DRG resonator compared with prior art designs since every ring of the DRG may be contributing to a change of the OPE capacitance and therefore capacitive sensitivity may be proportional to the DRG resonator area rather than its perimeter or radius alone.

For example, four (4) sets of out-of-plane electrodes (top and bottom) covering a ⅛ sector of the DRG with a 3 μm (micron) gap between the OPEs and the DRG top or bottom surface can achieve a 9× improvement with differential sensing compared to a conventional fabricated peripheral electrode with a 10 μm sensing gap. The inventors have shown that a finite element analysis (FEA) model can accurately predict the capacitive sensitivity, dC/dx, for any gyroscope resonator geometry, while a companion analytical solution can predict the upper and lower bound of this parameter.

Some embodiments of this presentation may enable increasing the capacitive sensitivity and thus the gyroscope performance (reduce noise floor) without having to resort to challenging deep silicon etching aspect ratio limits. For example, an aspect ratio limit of 70:1 (e.g. 350 μm thick Si with a 5 μm gap between the rings can be used according to embodiments of this presentation. Embodiments of this presentation can be manufactured using wafer bonding such as commonly used for the fabrication of Micro-Electro-Mechanical Systems (MEMS) devices. With wafer bonding, the sensing gap can be reduced to 3 µm or less, which allows achieving at least 9× improvement over a conventional fabricated peripheral electrode of same dimensions, with a 10 µm electrode/resonator gap. Adding Out-of-Plane electrodes according to embodiments of this presentation not only can improve sensitivity, but also reduce gyroscope acceleration sensitivity, because the out-of-plane electrodes can be used to null out gyroscope displacement due to acceleration.

Figure 2:
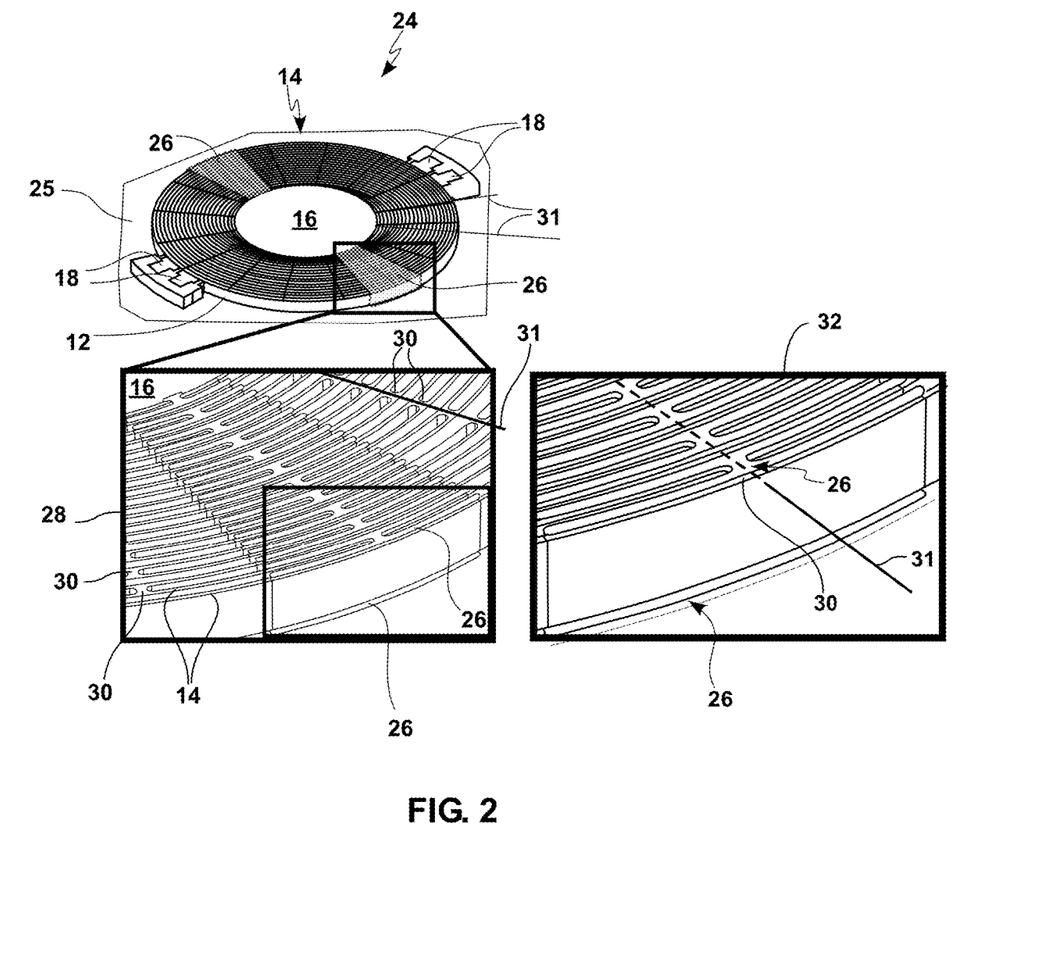
FIG. 2 illustrates a perspective view of a disk resonator sensor according to an embodiment of this presentation, as well as detailed view of sensing electrodes according to an embodiment of this presentation.

FIG. 2 illustrates a perspective view of a disk resonator sensor 24 according to an embodiment of this presentation, comprising as the known sensor 10 of FIG. 1, a resonator 12 having concentric rings 14 attached to a central support 16; where support 16 can be attached to a carrier base or substrate 25, maintaining rings 14 above substrate 25 by a predetermined gap (not shown). As in sensor 10, resonator disk 12 is arranged for resonating along a first plane, wherein said first plane can be the plane materialized by the rings 14; and as in sensor 10, sensor 24 comprises at least one driving electrode 18 (two differential driving electrodes 18 illustrated in FIG. 2) generally arranged along the same first plane as the rings 14, with a gap (for example of a few micrometers) between an inner-most active face of the electrodes and the outer-most surface of the outer-most ring 14 of resonator 12.

According to an embodiment of this presentation, sensor 24 comprises at least one sensing electrode structure 26; arranged on a second plane parallel to the plane materialized by the rings 14 at a predetermined distance of said rings 14 along a direction normal to said first plane. An enlarged section 28 of sensor 24 illustrates a portion of the rings 14, which are connected together and to support 16 by a predetermined number of radial supports 30, wherein the radial supports 30 attaching any first and second concentric rings 14 are not radially aligned with the radial supports 30 attaching said second concentric ring 14 to a third concentric ring 14. According to an embodiment of this presentation, the radial supports 30 attaching said third concentric ring 14 to a fourth concentric ring 14 are aligned with the radial supports 30 attaching said first and second concentric rings 14 along a "radial support axis 31". According to embodiments of this presentation, the various radial supports 30 of resonator 12 can be aligned along a number (e.g. sixteen) of regularly spaced outward-facing radial support axis 31.

Enlarged section 28 actually illustrates two sets of sensing electrodes or electrode structures 26 respectively arranged above and below resonator 12, each with a predetermined "vertical" gap between the sensing electrode 26 and the rings 14 of resonator 12 (assuming that the rings 14 materialize a "horizontal" plane). The top and bottom gaps can be the same or can be different. According to an embodiment of this presentation, the gap can be smaller than 10 µm.

It is to be noted that sensor 24 can also comprise at least one sensing electrode arranged along the same first plane as the at least one driving electrode 18, for example for backup or calibration. According to an embodiment of this presentation, in FIG. 2 one of the two driving electrodes 18 can be configured as a sensing electrode. Alternatively, sensor 24 can comprise in-plane sensing and driving electrodes as illustrated in FIG. 1.

An enlarged section 32 of enlarged section 28 illustrates in more details that each electrode structure 26 can comprise portions of a conducting layer materializing said second plane, said portions of conducting layer being shaped (e.g. by etching a uniform conducting layer—not shown—) to follow a normal projection on said second plane of a portion of the resonator 12. Thus, the electrode or electrode structure 26 can be discontinuous and comprised of segments shaped each as the projection of portions of the rings 14 and of the radial supports 30 that connect said portions of the rings together. According to an embodiment of this presentation, each of these individual segments of electrode 26 can be connected separately to a sensing input, so as to for example follow precisely how each pair of attached rings 14 deforms near electrode 26. According to an embodiment of this presentation, the portion of the resonator 12 that projects onto electrode 26 can comprise an angular quadrant straddling symmetrically a radial support axis 31. According to an embodiment of this presentation, said angular quadrant can occupy half of the resonator surface between a second radial support axis 31 immediately adjacent one side of said first radial support axis 31 and a third radial support axis 31 immediately adjacent the other side of said first radial support axis 31. It is noted that the embodiment above comprises a disk shaped resonator 12. However, according to embodiments of this presentation the resonator can have a different shape and/or can be supported by its periphery rather than by its center. According to embodiments of the present disclosure, sensor 24 can comprise between 16 and 48 peripheral electrodes 26.

Figure 3A:
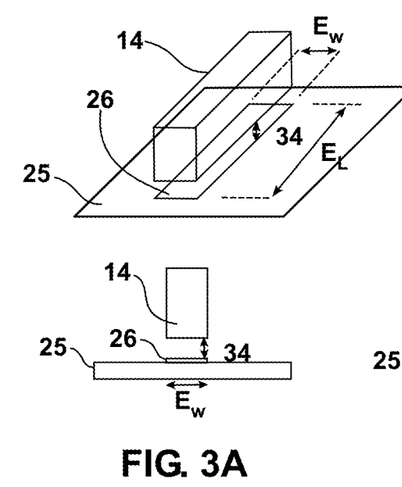
FIGS. 3A, 3B and 3C illustrate schematically single-ended sensing electrode structures according to embodiments of this presentation.

The top part of FIG. 3A illustrates schematically in perspective the structure of a portion of a sensor according to embodiments of this presentation, wherein the sensing electrodes 26 are only arranged below the resonator 12. The bottom part of FIG. 3A illustrates a cross-section of the top part of FIG. 3A. FIG. 3A shows a section of a ring 14, that is maintained above a sensing electrode 26 (a portion of which only is illustrated) by a gap 34. As outlined above, electrode 26 can be formed on a substrate 25. If $E_W$ is the width of the narrowest of ring 14 and electrode 26, a length $E_L$ of ring 14 and electrode 26 form a capacitance proportional to $E_W$ times $E_L$, and inversely proportional to the gap 34.

Figure 3B:
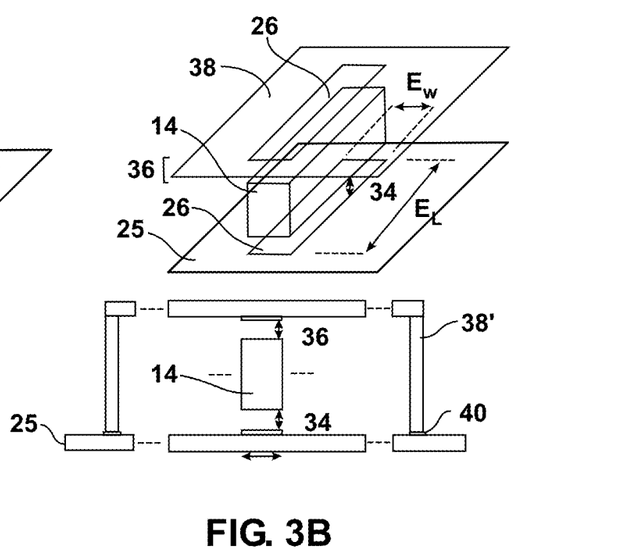

FIG. 3B is similar to FIG. 3A, except that it illustrates schematically the structure of a portion of a sensor according to embodiments of this presentation, having sensing electrodes 26 above as well as below the resonator disk 12. FIG. 3B shows a section of a ring 14, that is maintained above a bottom sensing electrode 26 (a portion of which only is illustrated) by a gap 34, and maintained below a top sensing electrode 26 (a portion of which only is illustrated) by a gap 36. If $E_w$ is the width of the narrowest of ring 14 and top electrode 26, a length $E_l$ of ring 14 and top electrode 26 form a capacitance proportional to $E_w$ times $E_l$, and inversely proportional to the gap 36. If for example gaps 34 and 36 are identical, and top and bottom electrodes are identical, the capacitive sensitivity of a sensor as illustrated in FIG. 3B can be twice the capacitive sensitivity of a sensor as illustrated in FIG. 3A.

The top electrode 26 can be formed on a bottom surface of a top substrate 38. According to an embodiment of this presentation, substrate 25 can be a baseplate wafer arranged for supporting the resonator 12, for example by its central support 16; and top substrate 38 can be a cap wafer covering the resonator 12; wherein the baseplate wafer 25 and the cap wafer 38 form an enclosure of the disk resonator 12 and the cap wafer 38 comprises a single wafer with a cavity forming a wall 38' surrounding the disk resonator 12 and the wall 38' is bonded 40 to the baseplate wafer 25 to enclose the disk resonator 12. It is noted that the use of a top substrate 38 to form with bottom substrate 25 a cavity for the resonator 12 can be implemented for any embodiment of this presentation.

Figure 3C:
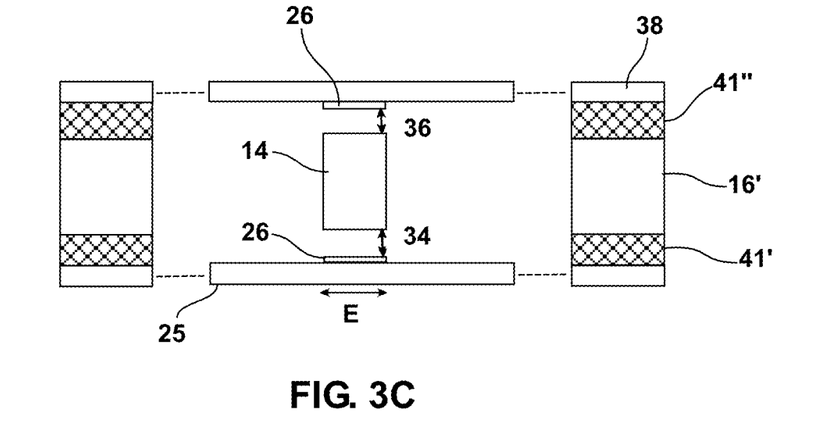

Alternatively to the disk resonator having a central support 16 as illustrated in FIG. 2, the disk resonator can have no central support structure and instead comprise a peripheral support structure having a circular cavity to the inside of which the concentric rings 14 are attached. In such a case and as illustrated in FIG. 3C, the baseplate wafer 25 can support disk resonator 12 by the bottom of its peripheral support structure 16'; and cap wafer 38 can be attached to the top of the peripheral support structure 16', and cover the disk resonator 12. According to embodiments of this presentation, the baseplate wafer 25, the cap wafer 38 and the peripheral support structure 16' form an enclosure of the disk resonator 12. As detailed above in relation with FIG. 3B, at least one sensing electrode structure 26 can then be arranged on one of the baseplate wafer 25 and cap wafer 38 inside the cavity. According to an embodiment of this presentation, driving electrodes of the disk resonator 12 can then be provided within the inner periphery of the innermost of rings 14.

According to embodiments of this presentation, if the height of support structure 16' is the same as the height of disk resonator 12, spacer layers 41', 41" can be used to attach the peripheral support structure 16' to respectively baseplate wafer 25 and the cap wafer 38, to maintain a space above and below the rings 14.

Figure 4A:
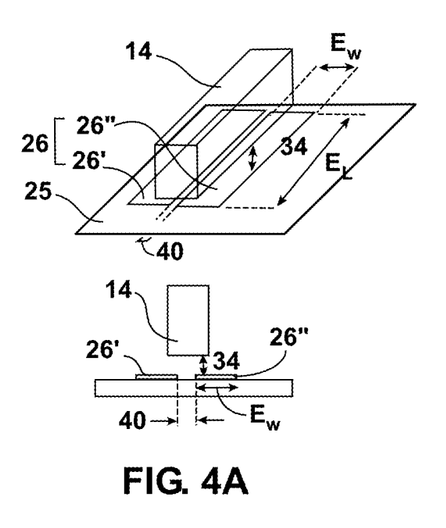
FIGS. 4A, 4B and 4C illustrate schematically differential sensing electrode structures according to embodiments of this presentation.

The top part of FIG. 4A illustrates schematically in perspective the structure of a portion of a sensor according to embodiments of this presentation, wherein the sensing electrode structures 26 are only arranged below the resonator disk 12, and where each sensing electrode structure 26 is a differential electrode structure comprising two conductors 26', 26" separated by a gap 40. Similarly to FIG. 3, the bottom part of FIG. 4A illustrates a cross-section of the top part of FIG. 4A. Similarly to FIG. 3, FIG. 4A shows a section of a ring 14 maintained a gap 34 above a sensing electrode 26 formed on a substrate 25. As outlined hereafter, differential sensing electrode 26 can be used as a differential electrode but can also be used as a non-differential electrode, for example by connecting one of the conductors 26', 26" to a same voltage as rings 14 (for example a ground potential).

Figure 4B:
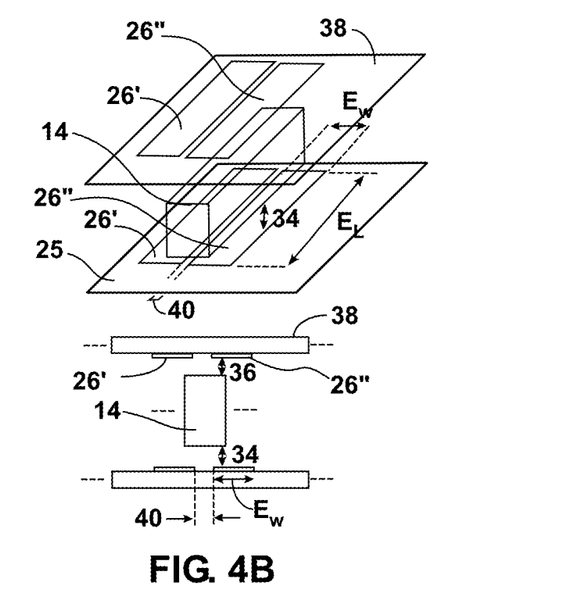

FIG. 4B is similar to FIG. 3B, except that it illustrates schematically the structure of a portion of a sensor according to embodiments of this presentation, wherein electrode structure 26 is a differential electrode structures 26 above as well as below the resonator disk 12. FIG. 4B shows a section of a ring 14, that is maintained above a bottom sensing electrode 26 (a portion of which only is illustrated) by a gap 34, and maintained below a top sensing electrode 26 (a portion of which only is illustrated) by a gap 36. As detailed in relation with FIG. 3B, top electrode 26 can be formed on a bottom surface of a top substrate 38, that can optionally form a cavity for the resonator with the bottom substrate 25. According to embodiments of this presentation, when electrode structures 26 are differential electrodes or electrode structures 26, electrode structures 26 can still follow normal projections of ring portions, as detailed previously.

Figure 4C:
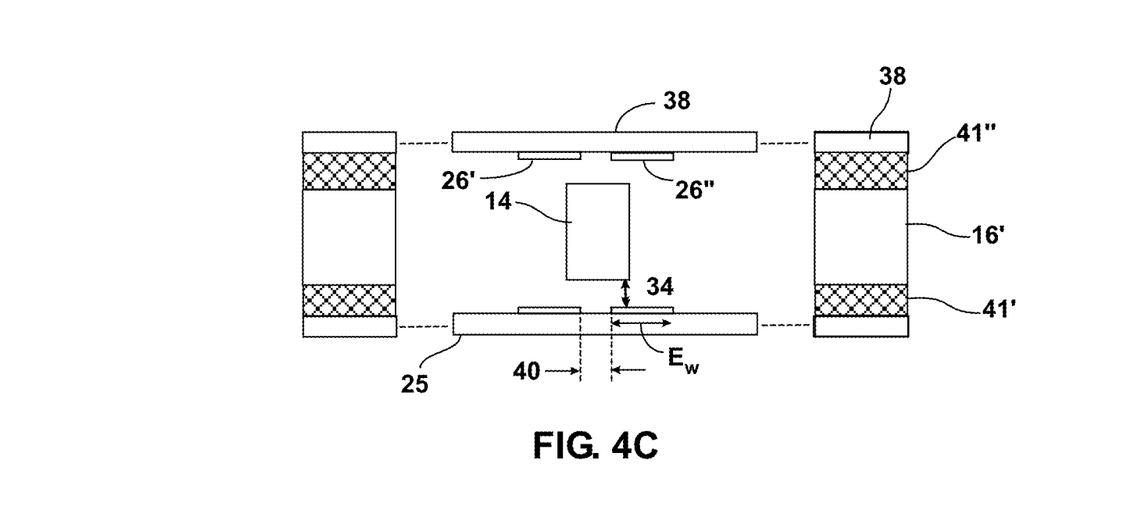

FIG. 4C is similar to FIG. 3C, except that it illustrates schematically the structure of a portion of a sensor according to embodiments of this presentation, wherein electrode structure 26 is a differential electrode structures 26 above as well as below the resonator disk 12. FIG. 4C shows a section of a ring 14, that is maintained by a peripheral support 16' above a bottom sensing electrode 26 (a portion of which only is illustrated) by a gap 34, and maintained below a top sensing electrode 26 (a portion of which only is illustrated) by a gap 36.

Figure 5:
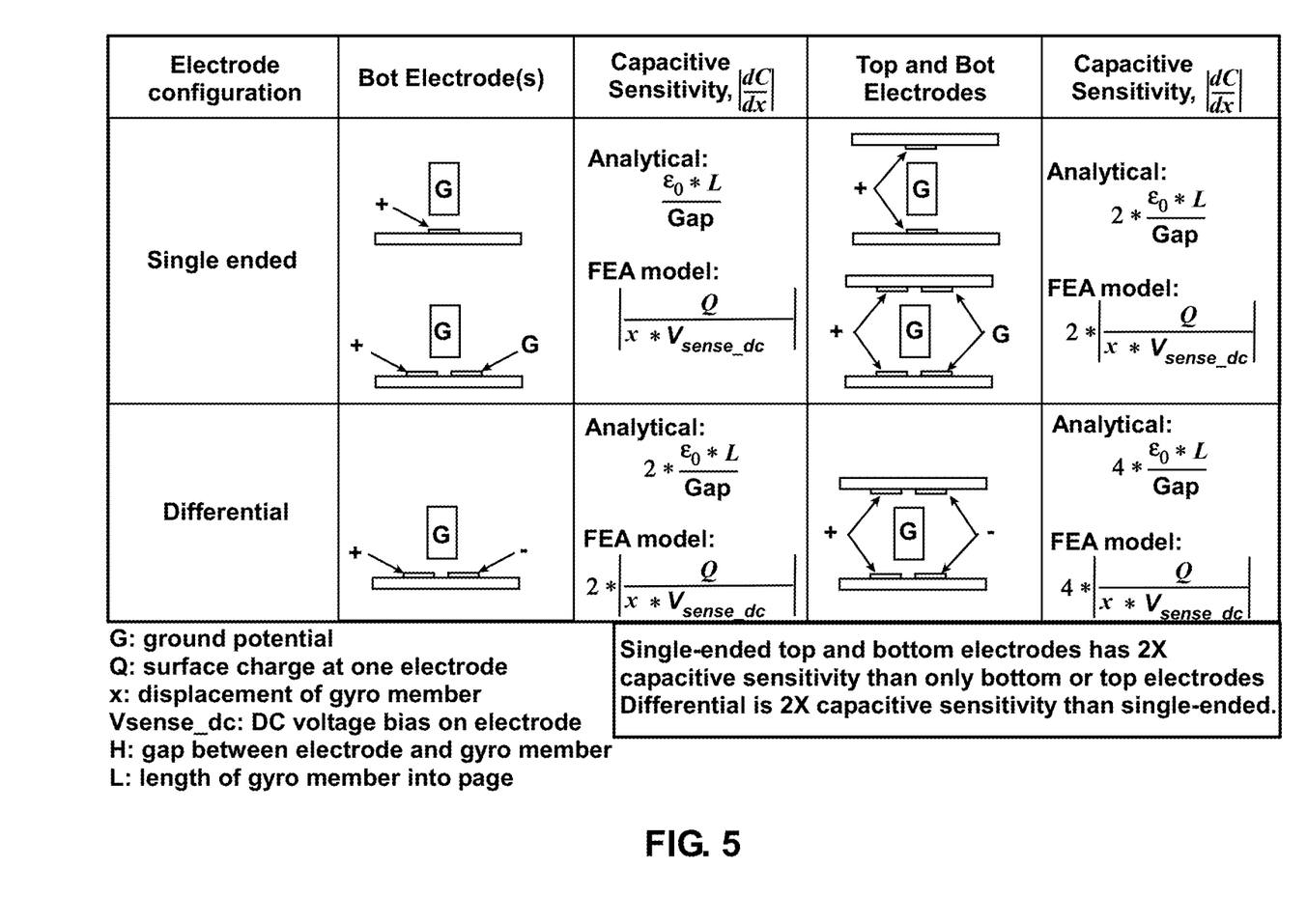
FIG. 5 is a table summarizing the properties of sensing electrodes according to embodiments of this presentation.

FIG. 5 is a table showing the capacitive sensitivity of sensing electrodes as illustrated in FIGS. 3A, 3B, 4A and 4B, both according to a Finite Element Analysis (FEA) model and an analytical solution.

Low noise floor or bias instability (<0.01°/hr) is important to achieve navigational grade gyroscope. Increasing the scale factor or reducing electronic noise can lower the noise floor. Embodiments of this presentation allow increasing the scale factor (SF). The scale factor (SF) can be expressed as a function of capacitive sensitivity dC/dx, as shown in Eq. 1 below, where V is a driving voltage, k is an angular gain, x is the maximum displacement at resonance, and dC/dx is the capacitive sensitivity. Any of these parameter can be increased to increase the scale factor, but embodiments of this presentation focus on capacitive sensitivity.

$$SF = V * k * Q * x * \underbrace{\frac{dC}{dx}}_{\text{Capacitive Sensitivity}} \Longrightarrow SF \propto \frac{dC}{dx} \quad \text{(Eq. 1)}$$

Capacitive sensitivity is the capacitance change due to displacement of the gyro ring relative to sensing electrode(s). For example, a Silicon Disk Resonator Gyroscope (DRG) with Out-of-Plane sensing electrodes highlighted in blue such as shown in FIG. 2 comprises two sets of peripheral driving electrodes 18 located at 3 and 9 o'clock relative to resonator 12. The embodiment comprise Out-of-Plane electrodes, namely two sets of top and bottom electrodes 26 respectively located at 6 and 12 o'clock relative to the resonator. The top sensing electrodes 26 are directly above of the top surface of the resonator 12 with a separation gap (sensing gap) 36, and the bottom sensing electrodes 26 are directly below the bottom surface of resonator 12 with a separation gap (sensing gap) 34 that can be the same as gap 36. In the embodiment illustrated in FIG. 2, the Out-of-Plane electrodes 26 follow a pattern identical to the pattern of the resonator 12 (electrodes 26 are a vertical projection of the resonator 12), and cover 1/16 of the arc length of the ring circumference of disk 12. According to another embodiment, the OPEs 26 can cover 1/8 of the arc length, which is the case considered in subsequent simulation results.

The electrode configuration illustrated in FIG. 2 (and also FIG. 3B) has non-differential sensing electrodes and is for single-ended sensing.

It is noted that using differential electrodes as illustrated in FIGS. 4A and 4B doubles the sensitivity of the sensors sensing a same number of rings.

Figure 6:
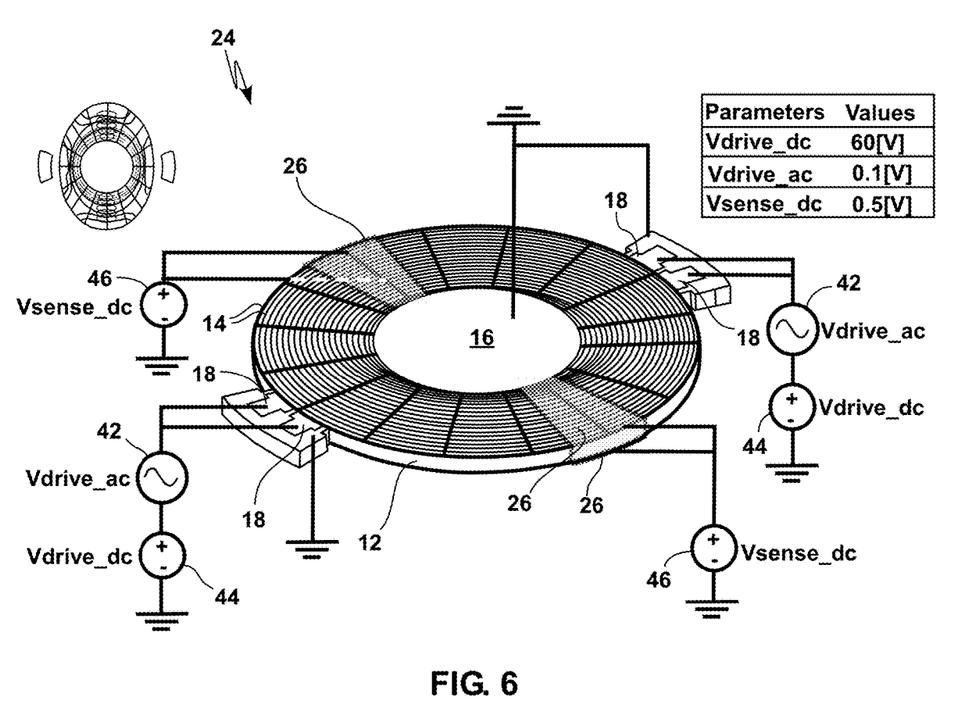
FIG. 6 illustrates a possible electrical connection of a sensor according to an embodiment of this presentation.

FIG. 6 illustrates a possible electrical connection of a sensor 24 such as illustrated in FIG. 2, where the rings 14 of resonator 12 are connected to the ground by central support 16; driving electrodes 18 are connected to ac driving voltage sources 42 (e.g. 0.1V), for example polarized by dc polarization sources 44 (e.g. 60V); and sensing electrodes 26 are connected to dc polarization sources 46 (e.g. 0.05V).

Figure 7:
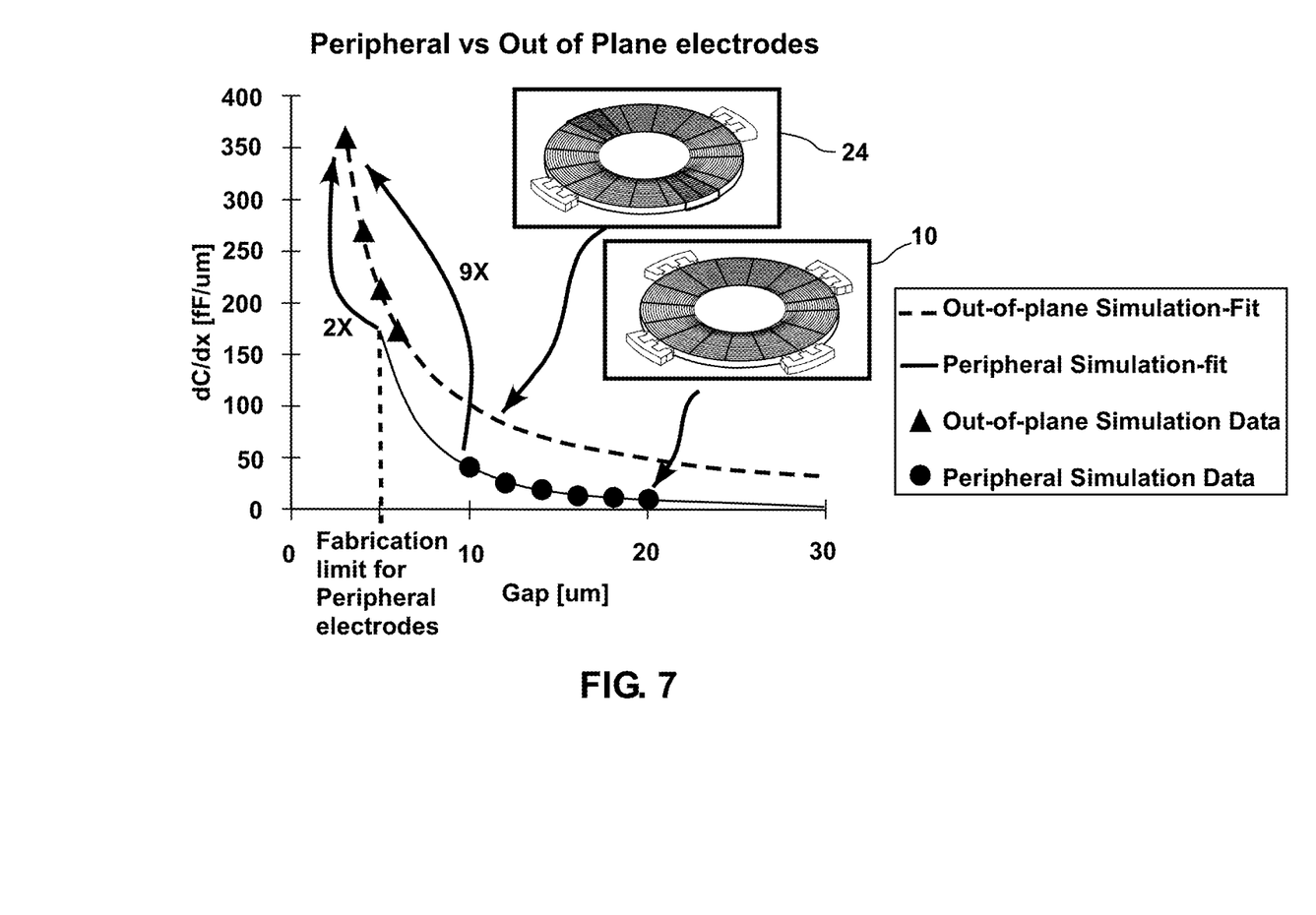
FIG. 7 comprises curves illustrating the comparative sensitivity of a sensor according to embodiments of this presentation and a known sensor.

FIG. 7 shows the plot of capacitive sensitivity dC/dx as a function of sensing gap between gyro resonator and the sensing electrodes; for a known sensor 10, such as illustrated in FIG. 1 and for a sensor 24 according to embodiments of this presentation, such as illustrated in FIG. 6. Sensor 10 comprises a total of 4 sets of peripheral electrodes (2 sets of driving electrodes 18 and 2 sets of sensing electrodes 20). Sensor 24 comprises 4 sets of out-of-plane electrodes 26 (2 sets of top and 2 sets of bottom sensing electrodes) replacing the 2 set of peripheral sensing electrodes 20 (at 6 and 12 o'clock). It is noted that the smallest sensing gap ("horizontal" gap) for known peripheral sensing electrodes is 10 μm (for a 350 μm thick Si resonator 12), which leads to a sensitivity of 40 fF/μm. If the sensing gap were reduced to 5 μm (which has not yet been practically achieved), COMSOL simulation shows an improvement of about 4.3× to 173 fF/μm. However, it is noted that reducing the sensing gap for peripheral electrode configuration is very difficult and will take a lot of effort, in particular to achieve a uniform gap throughout the whole thickness of the disk (e.g. 350 μm for a Si resonator). On another hand, a sensor according to embodiments of this presentation, with Out-of-Plane electrodes 26, can be easily achieved by wafer bonding and have a 3 μm sensing gap (vertical). According to an embodiment of this presentation, such a narrow vertical gap can be achieved by using a sacrificial material layer that is removed at a last fabrication step. As illustrated in FIG. 7, Out-of-Plane electrodes 26 (e.g. 4 sets that cover ⅛ of the arc length, as illustrated in FIG. 7) can achieve a 9× improvement over the best known fabricated peripheral electrodes (having a 10 μm gap).

Figure 8:
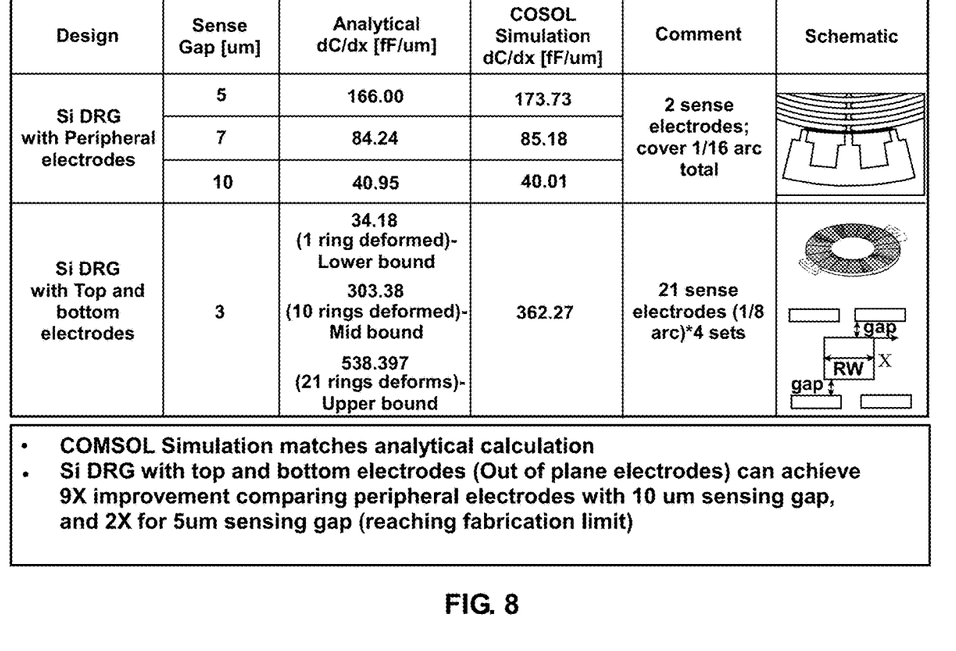
FIG. 8 is a table summarizing the properties of sensors according to embodiments of this presentation and known sensors.

FIG. 8 is a table summarizing analytical and COMSOL FEA simulation results for various sensors 10 (Silicon, with peripheral sensing electrodes) as well as a sensor 24 according to embodiments of this presentation. It is noted that for sensor 10, the displacement at the outermost ring is relatively easier calculated by the resonance N=2 mode shape. However, for sensor 24, it is very important to know how much each ring deform to predict the capacitive sensitivity. Analytical calculation can predict the upper and lower bound of the performance, and with some assumptions, one can almost match the FEA model result. The FEA model can accurately predict the performance for different resonator geometries, even if the resonator does not comprise uniform rings as illustrated in this presentation.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom.

Applicant has made this presentation with respect to the current state of the art, but also contemplates advancements and that adaptations in the future may take into consideration of those advancements, namely in accordance with the then current state of the art. Reference to a feature element in the singular is not intended to mean "one and only one" unless explicitly so stated. Moreover, no element, component, nor method or process step in this presentation is intended to be dedicated to the public regardless of whether the element, component, or step is explicitly recited in this presentation. No element disclosed herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A sensor comprising:
   a resonator structure arranged for resonating along a first plane, said resonator structure comprising a first plurality of concentric rings attached to each other by a predetermined number of radial supports; and
   a second plurality of sensing electrode structures, arranged on a second plane parallel to said first plane at a predetermined distance of said resonator structure along a direction normal to said first plane such that a third plurality of rings of the resonator structure form an out-of-plane capacitance with said second plurality of sensing electrode structures.

2. The sensor of claim 1, comprising at least one driving electrode arranged along said first plane.

3. The sensor of claim 1, comprising at least one sensing electrode arranged along said first plane.

4. The sensor of claim 1, wherein said second plurality of sensing electrode structures comprises a fourth and a fifth pluralities of sensing electrode structures arranged parallel to said first plane on opposite sides of said first plane at first and second predetermined distances of said resonator structure along a direction normal to said first plane.

5. The sensor of claim 1, wherein said predetermined distance is smaller than 10 micrometer.

6. The sensor of claim 1, wherein said at least one sensing electrode structure comprises a conducting layer that follows a normal projection of a portion of the resonator structure on said second plane.

7. A sensor comprising:
   a resonator structure arranged for resonating along a first plane; and
   at least one sensing electrode structure arranged on a second plane parallel to said first plane at a predetermined distance of said resonator structure along a direction normal to said first plane;
   wherein said at least one sensing electrode structure is a differential electrode comprising two conductors separated by a gap.

8. A sensor comprising:
   a resonator structure arranged for resonating along a first plane; and
   at least one sensing electrode structure arranged on a second plane parallel to said first plane at a predetermined distance of said resonator structure along a direction normal to said first plane; wherein the resonator structure comprises a disk resonator having a peripheral support structure;
   and wherein:
   a baseplate wafer supports the disk resonator at the peripheral support structure; and
   a cap wafer covers the disk resonator, attached to the peripheral support structure;
   wherein the baseplate wafer, the cap wafer and the peripheral support structure form an enclosure of the disk resonator; and
   wherein said least one sensing electrode structure is arranged on one of said baseplate wafer and cap wafer inside said cavity.

9. A sensor comprising:
   a resonator structure arranged for resonating along a first plane; and
   at least one sensing electrode structure arranged on a second plane parallel to said first plane at a predetermined distance of said resonator structure along a direction normal to said first plane; wherein the resonator structure comprises a disk resonator; wherein the disk resonator comprises a central support; and wherein:

a baseplate wafer supports the disk resonator at the central support; and a cap wafer covers the disk resonator;

wherein the baseplate wafer and the cap wafer form an enclosure of the disk resonator, the cap wafer comprising a single wafer having a cavity forming a wall surrounding the disk resonator and the wall being bonded to the baseplate wafer to enclose the disk resonator; and wherein said least one sensing electrode is arranged on one of said baseplate wafer and cap wafer inside said cavity.

10. A sensor comprising:

a resonator structure arranged for resonating along a first plane; and at least one sensing electrode structure arranged on a second plane parallel to said first plane at a predetermined distance of said resonator structure along a direction normal to said first plane;

wherein the resonator structure comprises a disk resonator wherein the disk resonator comprises a number of concentric rings attached to each other by a predetermined number of radial supports, wherein the radial supports attaching any first and second concentric rings are not radially aligned with the radial supports attaching said second concentric ring to a third concentric ring.

11. The sensor of claim 10, wherein said predetermined number is 8 or is a multiple of 4.

12. The sensor of claim 10, wherein the radial supports attaching said third concentric ring to a fourth concentric ring are aligned along a radial support axis with the radial supports attaching said first and second concentric rings.

13. The sensor of claim 10, wherein said at least one sensing electrode structure comprises a conducting layer that follows a normal projection of a portion of the resonator structure on said second plane; said portion of the resonator structure comprising an angular quadrant arranged symmetrically on both sides of a first radial support axis.

14. The sensor of claim 13, wherein said angular quadrant occupies half of the resonator surface between a second radial support axis immediately adjacent one side of said first radial support axis and a third radial support axis immediately adjacent the other side of said first radial support axis.

15. A method of fabricating a sensor, the method comprising:

fabricating a disk resonator structure having a peripheral support structure and arranged for resonating along a first plane; and fabricating at least one sensing electrode structure on a second plane, parallel to said first plane, at a predetermined distance of said resonator structure along a direction normal to said first plane;

the method further comprising:

providing a baseplate wafer for supporting the disk resonator at the peripheral support structure; and attaching to the peripheral support structure a cap wafer covering the disk resonator;

wherein the baseplate wafer, the cap wafer and the peripheral support structure form an enclosure of the disk resonator;

wherein said fabricating at least one sensing electrode structure comprises fabricating said at least one sensing electrode structure on one of said baseplate wafer and cap wafer inside said cavity.

16. A method of fabricating a sensor, the method comprising:

fabricating a disk resonator structure having a central support and arranged for resonating along a first plane; and fabricating at least one sensing electrode structure on a second plane, parallel to said first plane, at a predetermined distance of said resonator structure along a direction normal to said first plane;

the method further comprising:

providing a baseplate wafer for supporting the disk resonator at the central support; and providing a cap wafer covering the disk resonator;

wherein the baseplate wafer and the cap wafer form an enclosure of the disk resonator, the cap wafer comprising a single wafer with a cavity forming a wall surrounding the disk resonator and the wall being bonded to the baseplate wafer to enclose the disk resonator;

wherein said fabricating at least one sensing electrode structure comprises fabricating said at least one sensing electrode structure on one of said baseplate wafer and cap wafer inside said cavity.

\* \* \* \* \*